US006937043B2

(12) United States Patent
Okubo

(10) Patent No.: US 6,937,043 B2
(45) Date of Patent: Aug. 30, 2005

(54) APPARATUS AND METHOD FOR TESTING ELECTRONIC COMPONENT

(75) Inventor: Hiroshi Okubo, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/780,418

(22) Filed: Feb. 17, 2004

(65) Prior Publication Data

US 2004/0178813 A1 Sep. 16, 2004

(30) Foreign Application Priority Data

Mar. 13, 2003  (JP) ....................................... 2003-068560

(51) Int. Cl.[7] ............................................. G01R 31/02
(52) U.S. Cl. ...................................... 324/755; 324/765
(58) Field of Search ................................ 324/754–765, 324/158.1, 73.1, 133; 439/66–72, 90, 692, 621, 824; 337/187–191

(56) References Cited

U.S. PATENT DOCUMENTS 4,281,888 A * 8/1981 Seaman ....................... 439/692
5,088,190 A * 2/1992 Malhi et al. .................. 29/843
5,578,796 A * 11/1996 Bhatt et al. ................. 174/260
6,181,147 B1 * 1/2001 Itoh ............................ 324/755

FOREIGN PATENT DOCUMENTS

JP    2001-332460    11/2001

* cited by examiner

Primary Examiner—Vinh P. Nguyen
(74) Attorney, Agent, or Firm—Keating & Bennett, LLP

(57) ABSTRACT

An apparatus for testing an electronic component includes a substrate having a cavity on the upper surface for accommodating an electronic component. The electronic component is inserted into the cavity from a second electrode side. From under the cavity, a connecting conductor extends in a direction that is substantially perpendicular to the thickness direction of the substrate. The connecting conductor is electrically connected to a through-hole electrode. The upper end of the through-hole electrode is further connected to a terminal pad placed on the upper surface of the substrate. Characteristics of the electronic component are measured by attaching a first probe and a second probe to a first substrate of the electronic component and the terminal pad, respectively.

11 Claims, 7 Drawing Sheets

APPARATUS AND METHOD FOR TESTING ELECTRONIC COMPONENT

BACKGROUND OF THE INVENTION

1. Field of the Invention

The present invention relates to apparatuses and methods for testing electronic components, for example, for testing characteristics of chip electronic components such as a monolithic ceramic capacitor and a composite high-frequency component. In particular, the present invention relates to an apparatus and a method for testing an electronic component, wherein the electronic component is inserted into a cavity of a substrate and characteristics of the electronic component are measured by a probe.

2. Description of the Related Art

Various types of testing apparatuses are used in the process of measuring and testing characteristics of ceramic electronic components such as a monolithic ceramic capacitor.

FIG. 5 is a perspective view showing an example of known apparatuses for testing electronic components. In this example, characteristics of an electronic component 51 are measured with probes 52 and 53. The electronic component 51 includes a main body 51a, and electrodes 51b and 51c disposed at both ends of the main body 51a. The electronic component 51 is disposed in a cavity of a substrate (not shown) such that the electrodes 51b and 51c are arranged at the upper and lower ends of the electronic component 51, respectively. To measure the characteristics of the electronic component 51, the probes 52 and 53 are attached to the electrodes 51b and 51c, respectively, in the directions of arrows in FIG. 5. The probes 52 and 53 are easily positioned because they are attached to the electrodes 51b and 51c at the end surfaces of the electronic component 51.

However, recent size reduction of electronic components causes some problems. The probe 53, which is located below the electronic component 51, passes through a hole in the substrate to access the electrode 51c. For testing an electronic component with reduced size, the size of the cavity for accommodating the electronic component 51 is reduced, accordingly. The size of the hole for enabling the probe 53 to pass through is even smaller than that of the cavity. In this case, a general-purpose probe having a relatively large diameter cannot pass through the hole. That is, characteristics of an electronic component with reduced size cannot be measured.

Referring now to FIG. 6, the probes 52 and 53 are attached to the electrodes 51b and 51c, respectively, on the upper surface of the electronic component 51. The electronic component 51 is inserted into a cavity having an opening at the top (not shown). The probes 52 and 53 can be attached to the electrode 51b and 51c through the opening of the cavity. Testing a small electronic component, in this case, is relatively easy.

However, as the size of the electronic component 51 further decreases, the probes 52 and 53 cannot be reliably attached to the electrodes 51b and 51c, because the size of the upper portions of the electrodes 51b and 51c decrease, accordingly.

In addition, the probes 52 and 53 always require some adjustments, because the spacing between the electrodes 51b and 51c, and the size of the upper portions of the electrodes 51b and 51c vary from electronic component to electronic component.

FIG. 7 illustrates an apparatus for testing an electronic component disclosed in Japanese Unexamined Patent Application Publication No. 2001-332460 (hereinafter referred to as "Patent Document 1"). A substrate 61 has a cavity 62 opening at the top, and the electronic component 51 is contained in the cavity 62. A conductive plate 63 is bonded to the lower surface of the substrate 61. The conductive plate 63 has a hole 63a opposing the cavity 62. In this apparatus for testing an electronic component, the electronic component 51 is inserted into the cavity 62 for allowing the electrode 51c of the electronic component 51 to be attached to the conductive plate 63. Subsequently, the probe 64 located above the electronic component 51 is attached to the electrode 51b on an end surface of the electronic component 51. Characteristics of the electronic component 51 are thus measured with the conductive plate 63 and the probe 64. In the apparatus for testing electronic components disclosed in Patent Document 1, a plurality of the cavities 62 are provided on the substrate 61, and the conductive plates 63 are arranged so as to extend to the lower surfaces of all of the cavities 62.

Even if a small-sized electronic component is tested, the conductive plate 63 is reliably attached to the electrode 51c of the electronic component 51, while the probe 64 is easily attached to the upper electrode 51b.

Since the conductive plates 63 arranged under the cavities 62 are shared by a plurality of electronic components, however, use of this testing apparatus is limited to measurement of particular characteristics, such as insulation resistance, that can be measured even when one of the electrodes of the electronic component is shared with other electronic components. In other words, the apparatus for testing electronic components disclosed in Patent Document 1 cannot be used to simultaneously measure characteristics, such as capacitance, that cannot be measured when one of the electrodes of the electronic component is shared with other electronic components.

SUMMARY OF THE INVENTION

In order to overcome the problems described above, preferred embodiments of the present invention provide an apparatus and a method for testing an electronic component such that various characteristics of electronic components, including capacitance, that cannot be measured when one of the electrodes is shared by a plurality of electronic components, are easily and quickly measured by general-purpose probes, even if the size of the electronic components is reduced.

An apparatus for testing an electronic component, according to a preferred embodiment of the present invention, includes a substrate having at least one cavity on the upper surface thereof for accommodating an electronic component, at least one connecting conductor disposed at the interior of or on the lower surface of the substrate, and extending, from under the cavity, substantially perpendicularly to the thickness direction of the substrate, a through-hole electrode disposed in the vicinity of the cavity, having a lower end electrically connected to the connecting conductor, and having an upper end attached to the upper surface of the substrate, and a terminal pad disposed on the upper surface of the substrate and electrically connected to the upper end of the through-hole electrode.

In an apparatus for testing an electronic component according to a preferred embodiment of the present invention, the at least one connecting conductor includes a plurality of connecting conductors corresponding to electrodes of the electronic component, the connecting conductors are separated under the cavity, and the through-hole electrode and the terminal pad are provided for each connecting conductor.

According to another preferred embodiment of the present invention, an apparatus for testing an electronic component further includes a suction hole having a diameter that is smaller than that of the cavity, the suction hole opposing the cavity via the connecting conductor, and extending toward the outside of the substrate.

In an apparatus for testing an electronic component according to another preferred embodiment of the present invention, the suction hole passes through the connecting conductor.

In an apparatus for testing an electronic component according to another preferred embodiment of the present invention, a plurality of testing units, each having the cavity, the connecting conductor, and the terminal pad, are disposed in a circumferential direction.

A method for testing an electronic component using an apparatus for testing an electronic component according to preferred embodiments of the present invention, includes the steps of inserting the electronic component into the cavity for allowing a first electrode of the electronic component to contact the connecting conductor, and attaching a probe to the terminal pad for measuring the characteristics of the electronic component.

Other features, elements, characteristics, steps and advantages of the present invention will become more apparent from the following detailed description of preferred embodiments with reference to the attached drawings.

DETAILED DESCRIPTION OF PREFERRED EMBODIMENTS

Preferred embodiments of the present invention will now be described with reference to the drawings.

Figure 1A:
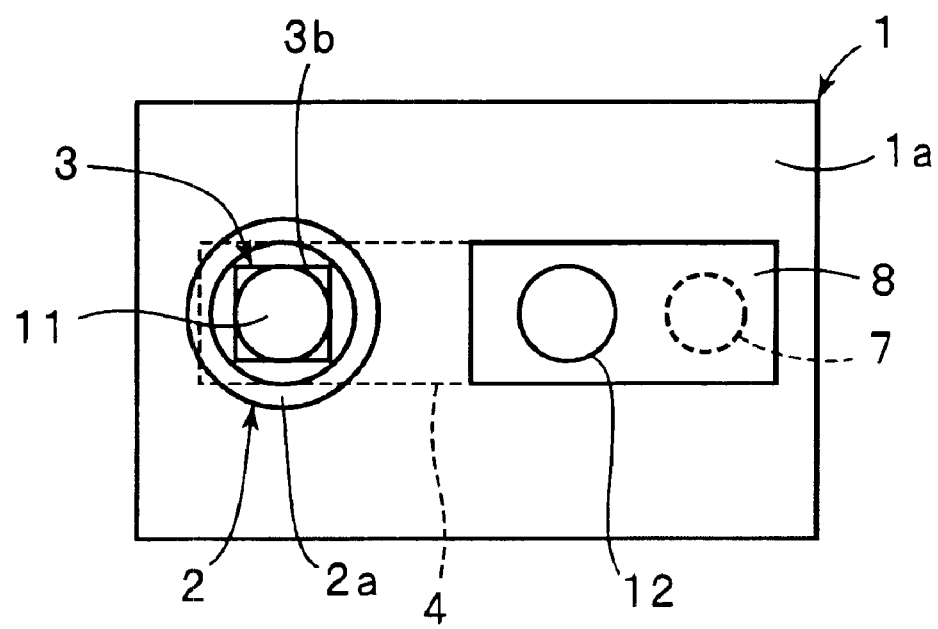
FIG. 1A and FIG. 1B are a plan view and a front sectional view, respectively, illustrating a unit for testing an electronic component according to a first preferred embodiment of the present invention.
Figure 1B:
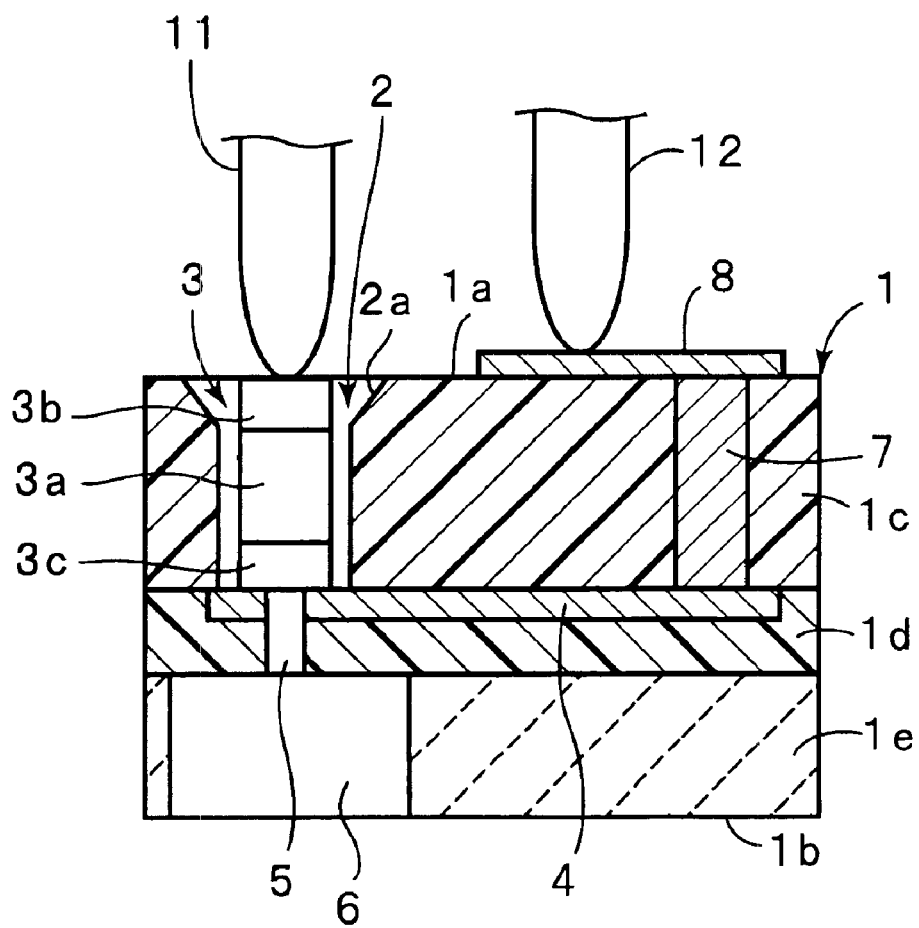
Figure 2:
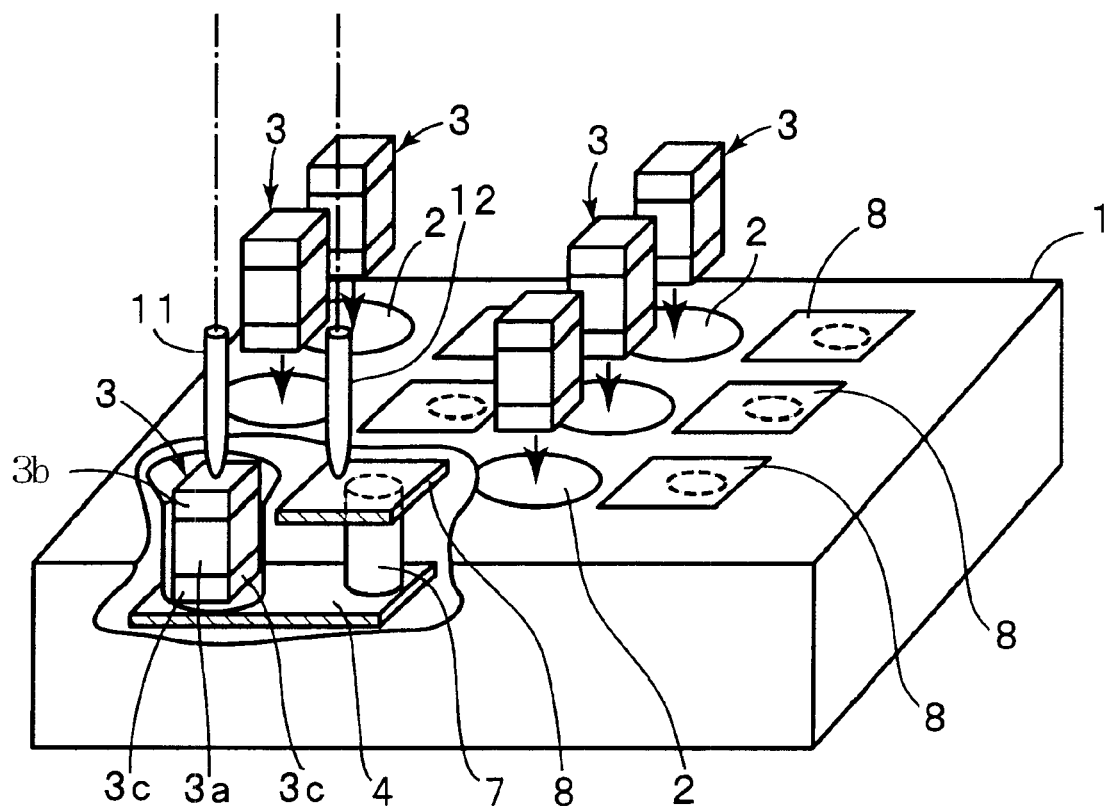
FIG. 2 is a partial-cutaway perspective view illustrating an apparatus for testing a plurality of electronic components according to the first preferred embodiment of the present invention.

FIGS. 1A, 1B, and 2 show an apparatus for testing electronic components according to the first preferred embodiment of the present invention.

Referring to FIGS. 1A and 1B, a unit for testing an electronic component has a cavity 2 on an upper surface 1a of a substrate 1. For accommodating an electronic component 3 (for example, about 0.4 mm in length (L), about 0.2 mm in width (W), and about 0.2 mm in height (H)), the depth of the cavity 2 is the same or greater than the longitudinal length of the electronic component 3, the longitudinal length being vertical in the drawing. That is, the entire electronic component 3 is vertically disposed in the cavity 2. The electronic component 3 may partially project from the substrate 1. In the present preferred embodiment, printed boards 1c, 1d, and an insulating base material 1e are stacked in layers to form the substrate 1. The lower surface of the insulating base material 1e is a lower surface 1b of the substrate 1.

A connecting conductor 4 is formed on the upper surface of the printed board 1d. From under the lower surface of the cavity 2, the connecting conductor 4 extends horizontally, in other words, substantially perpendicularly to the thickness direction of the printed board 1d. The connecting conductor 4 is made of, for example, patterned conductive films or metal foils bonded together.

A hole 5 is provided in the printed board 1d under the cavity 2. The diameter of the hole 5 is less than that of the cavity 2. The lower end of the hole 5 leads to a hole 6 provided in the insulating base material 1e. The holes 5 and 6 are preferably suction holes in preferred embodiments of the present invention. The hole 6 is further connected to a suction unit (not shown). Suction by the suction unit holds the electronic component 3 in the cavity 2, and permits an electrode 3c of the electronic component 3 to be tightly connected to the connecting conductor 4.

The electronic component 3 includes a main body 3a, and an electrode 3b and the electrode 3c that are disposed at both ends of the main body 3a. The electronic component 3 is preferably a monolithic ceramic capacitor in the present preferred embodiment.

The connecting conductor 4 is electrically connected to a through-hole electrode 7, which is disposed in the vicinity of the cavity 2 of the printed board 1c. The distance between the cavity 2 and the through-hole electrode 7 is about two to about five times the longitudinal length of the electronic component 3. The lower end of the through-hole electrode 7 is connected to the connecting conductor 4, while the upper end of the through-hole electrode 7 is electrically connected to a terminal pad 8 provided on the upper surface 1a of the substrate 1. The terminal pad 8 is, for example, about 1 mm square, and is slightly shifted toward the cavity 2 while being connected to the through-hole electrode 7. The terminal pad 8 is made of conductive materials. In this preferred embodiment, the terminal pad 8 is preferably made of a copper (Cu) layer coated with a nickel (Ni) layer. Alternatively, the terminal pad 8 may be made of any metal materials, such as metal foil bonded to the upper surface 1a of the substrate 1.

An inclined surface 2a is provided at the top opening of the cavity 2. Because of the inclined surface 2a, the diameter of the opening increases toward the top of the cavity 2.

A method of measuring characteristics of the electronic component 3 using the apparatus for testing electronic components according to the present preferred embodiment will now be described.

As shown in FIG. 2, a plurality of the units for testing electronic components are disposed on the substrate 1. Each electronic component 3 is inserted into the cavity 2 of each testing unit such that the electrode 3c is arranged at the bottom. This can be performed with a jig, such as an insertion jig. Since the inclined surface 2a is provided at the top of each cavity 2, the electronic component 3 are reliably inserted, from one electrode side, into the cavity 2, even if the electronic component 3 is randomly placed on the upper surface of the substrate 1 with, for example, an insertion jig.

The inserted electronic component 3 is attracted by the suction unit (not shown) via the holes 5 and 6. The electrode 3c of the electronic component 3 is sucked into the cavity 2 by the suction unit, and is tightly connected to the connecting conductor 4. For a smooth insertion of the electronic component 3 into the cavity 2, suction by this suction unit preferably starts before the insertion. Alternatively, the suction unit may be operated, after the insertion of the electronic component 3 into the cavity 2, to firmly attach the electrode 3c of the electronic component 3 to the connecting conductor 4.

In the next step, a first probe 11 and a second probe 12 are moved toward the substrate 1. The first probe 11 and the second probe 12 are then attached to the electrode 3b of the electronic component 3 and the terminal pad 8, respectively. The distance between the first probe 11 and the second probe 12 is about two to about four times the longitudinal length of the electronic component 3 (for example, about 0.5 mm to about 1.5 mm). The terminal pad 8 is electrically connected to the electrode 3c of the electronic component 3 via the above-described connecting conductor 4 and the through-hole electrode 7. Characteristics of the electronic component 3 can thus be measured using the probes 11 and 12.

In the present preferred embodiment, the probe 11 is attached to the electrode 3b at an end surface of the electronic component 3. Even if the size of the electronic component 3 is reduced, the electrode area is still sufficient for the tip of the probe 11. Therefore, the electrical connection between the probe 11 and the electrode 3b is ensured.

The probe 12 is attached to the top surface of the terminal pad 8. Regardless of the size of the electronic component 3, the probe 12 can be electrically and reliably connected to the terminal pad 8, and thus to the electrode 3c.

In the apparatus for testing electronic components according to the present preferred embodiment, characteristics of electronic components can be reliably and quickly measured with the general-purpose probes 11 and 12, even if the size of the electronic component 3 is reduced.

Moreover, each unit for testing an electronic component on the substrate 1 can independently measure the characteristics of the electronic component, with the probes 11 and 12. Unlike the related art described in Patent Document 1, the apparatus for testing electronic components according to the present preferred embodiment can be used for measuring characteristics, such as capacitance, that cannot be measured when one of the electrodes of the electronic component is shared with other electronic components.

Figure 3:
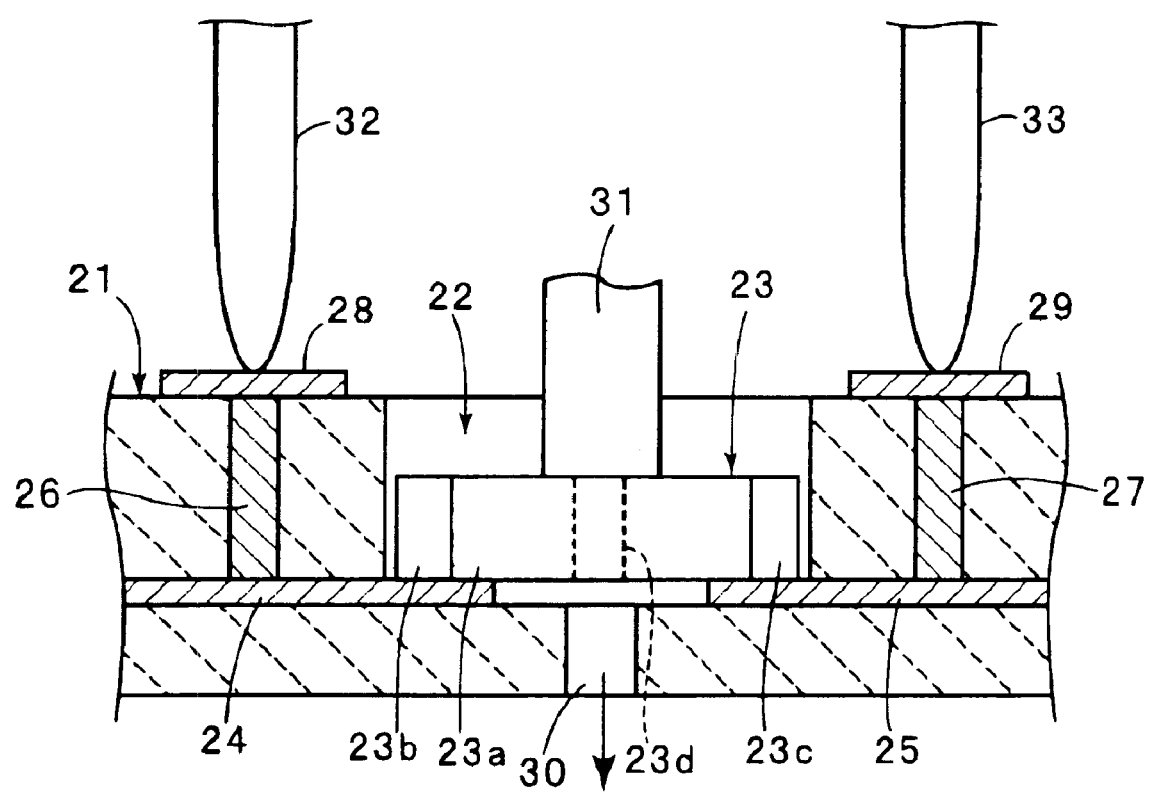
FIG. 3 is a partial-cutaway front sectional view of an apparatus for testing an electronic component according to a second preferred embodiment of the present invention.

FIG. 3 is a front sectional view of an apparatus for testing an electronic component according to a second preferred embodiment. A substrate 21 has a cavity 22 for accommodating an electronic component 23. The electronic component 23 includes a main body 23a, and a first electrode 22b and a second electrode 23c that are disposed at both ends of the main body 23a. In the present preferred embodiment, the electronic component 23 is disposed in the cavity 22 in a direction that enables the electrodes 22b and 23c to contact the bottom of the cavity 22.

At the mid-level of the substrate 21, a first connecting conductor 24 and a second connecting conductor 25 extend horizontally from under the cavity 22. The connecting conductors 24 and 25 are separated at the horizontal center of the cavity 22.

In this preferred embodiment, the first electrode 23b and the second electrode 23c are connected to the first connecting conductor 24 and the second connecting conductor 25, respectively. In the substrate 21, lower ends of a first through-hole electrode 26 and a second through-hole electrode 27 are electrically connected to the first connecting conductor 24 and the second connecting conductor 25, respectively. A first terminal pad 28 and a second terminal pad 29 are disposed on the upper surface of the substrate 21. The first terminal pad 28 and the second terminal pad 29 are electrically connected to the upper ends of the first through-hole electrode 26 and the second through-hole electrode 27, respectively.

A hole 30 opening at the lower surface of the cavity 22 leads to the lower surface of the substrate 21. The hole 30 is connected to a suction unit (not shown) for holding the electronic component 23 by suction.

A pressure jig 31 is preferably used in this preferred embodiment together with suction by the suction unit. The pressure jig 31 holds down the electronic component 23 in the cavity 22 to attach the electrodes 23b and 23c to the connecting conductors 24 and 25, respectively.

In this preferred embodiment, the electronic component 23 is disposed in the cavity 22 in the direction as shown in FIG. 3. Suction via the hole 30 by the suction unit (not shown) and pressure applied by the pressure jig 31 holds the electronic component 23 on the lower surface of the cavity 22. That is, the electrodes 23b and 23c of the electronic component 23 are firmly connected to the connecting conductors 24 and 25. Characteristics of the electronic component 23 are measured by attaching a first probe 32 and a second probe 33 to the terminal pad 28 and the terminal pad 29, respectively.

Even if the size of the electronic component 23 is reduced, that is, the areas of the electrodes 23b and 23c extending in the lower surface of the main body 23a are reduced, the electrodes 23b and 23c and the connecting conductors 24 and 25 still have surface contact with each other. Therefore, characteristics of the electronic component 23 can be easily and quickly measured by the general-purpose probes 32 and 33.

In the second preferred embodiment, a plurality of the testing units, shown in FIG. 3, are disposed in the substrate 21. Since it is not necessary to share one of the electrodes with other electronic components, various electrical characteristics of an electronic component, including capacitance, can be measured by each unit.

In FIG. 3, the electronic component 23 includes the electrodes 23b and 23c at both ends. Additionally, an external electrode 23d may be provided to wrap around the main body 23a, as indicated by the dashed lines in the middle of the substrate 21. A third connecting conductor, a through-hole electrode, and a terminal pad that are electrically connected to the electrode 23d may also be provided, in the same manner as the connecting conductor 24, the through-hole electrode 26, and the terminal pad 28. The apparatus for testing electronic components according to preferred embodiments of the present invention can also be applied, therefore, to measuring characteristic of electronic components having three or more electrodes.

Figure 4:
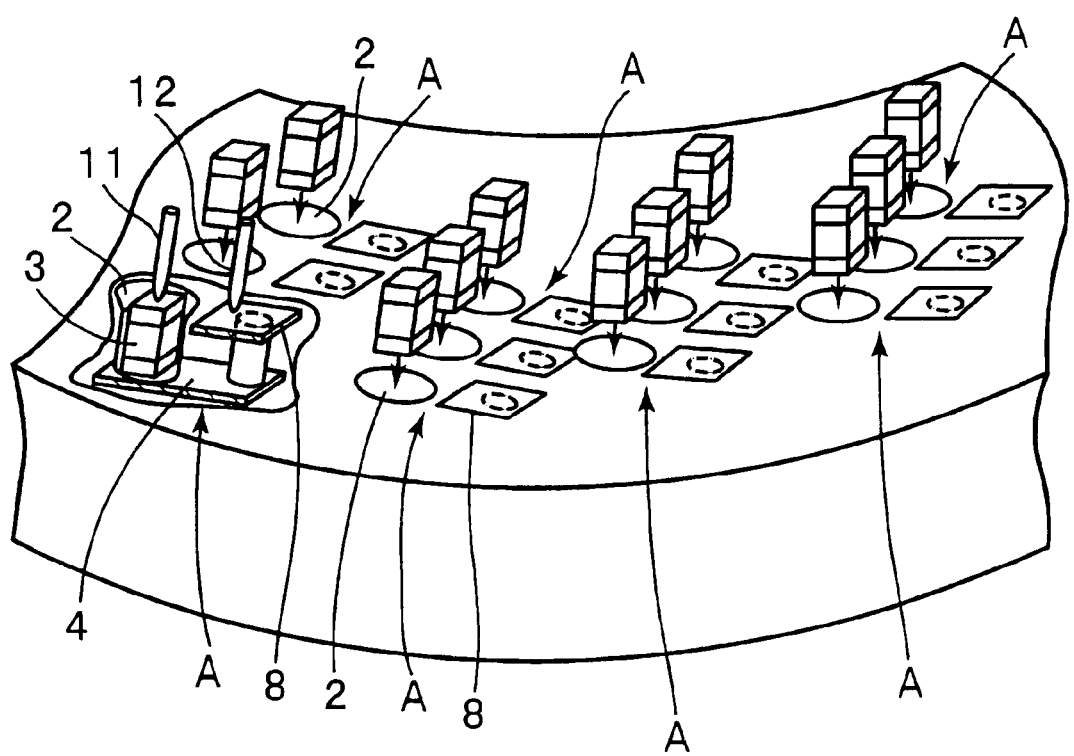
FIG. 4 is a partial-cutaway perspective view illustrating a modification of the apparatus for testing electronic components according to preferred embodiments of the present invention.
Figure 5:
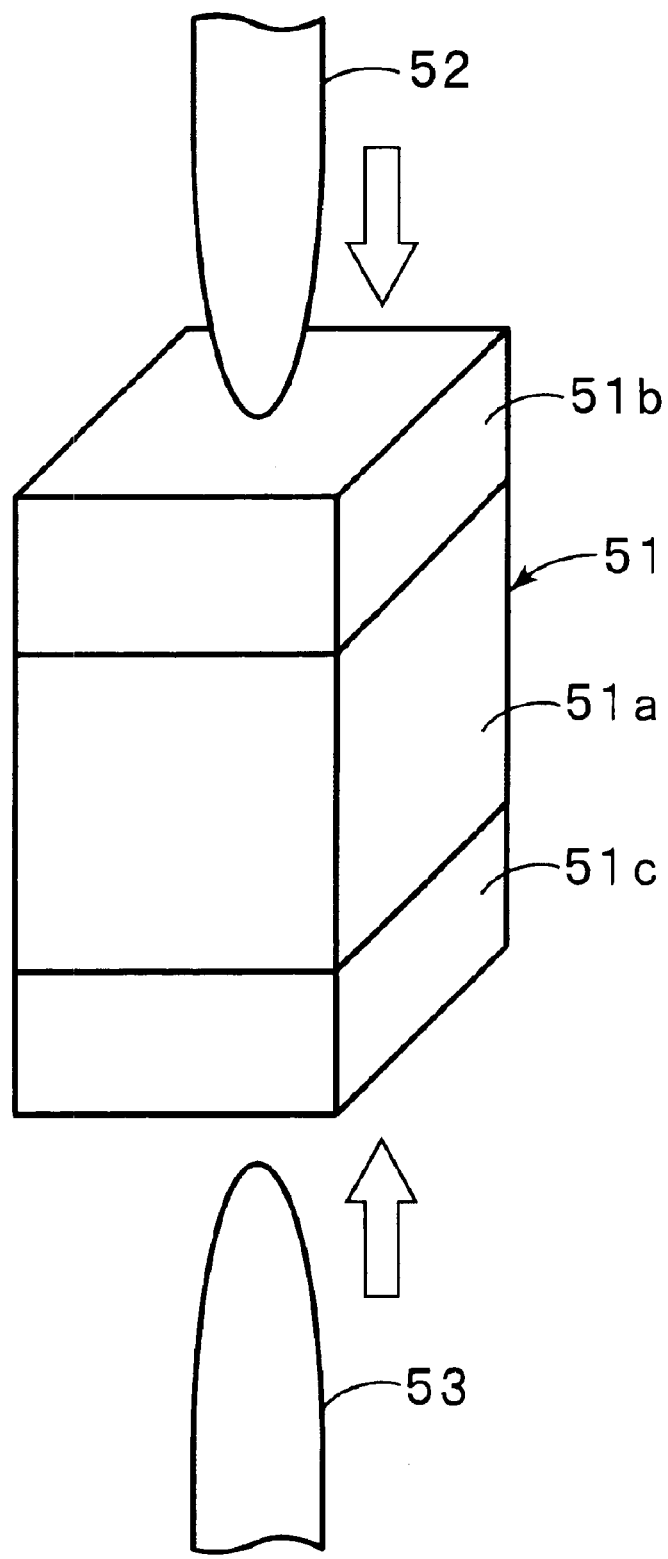
FIG. 5 is a perspective view showing a known example of an apparatus for testing an electronic component.
Figure 6:
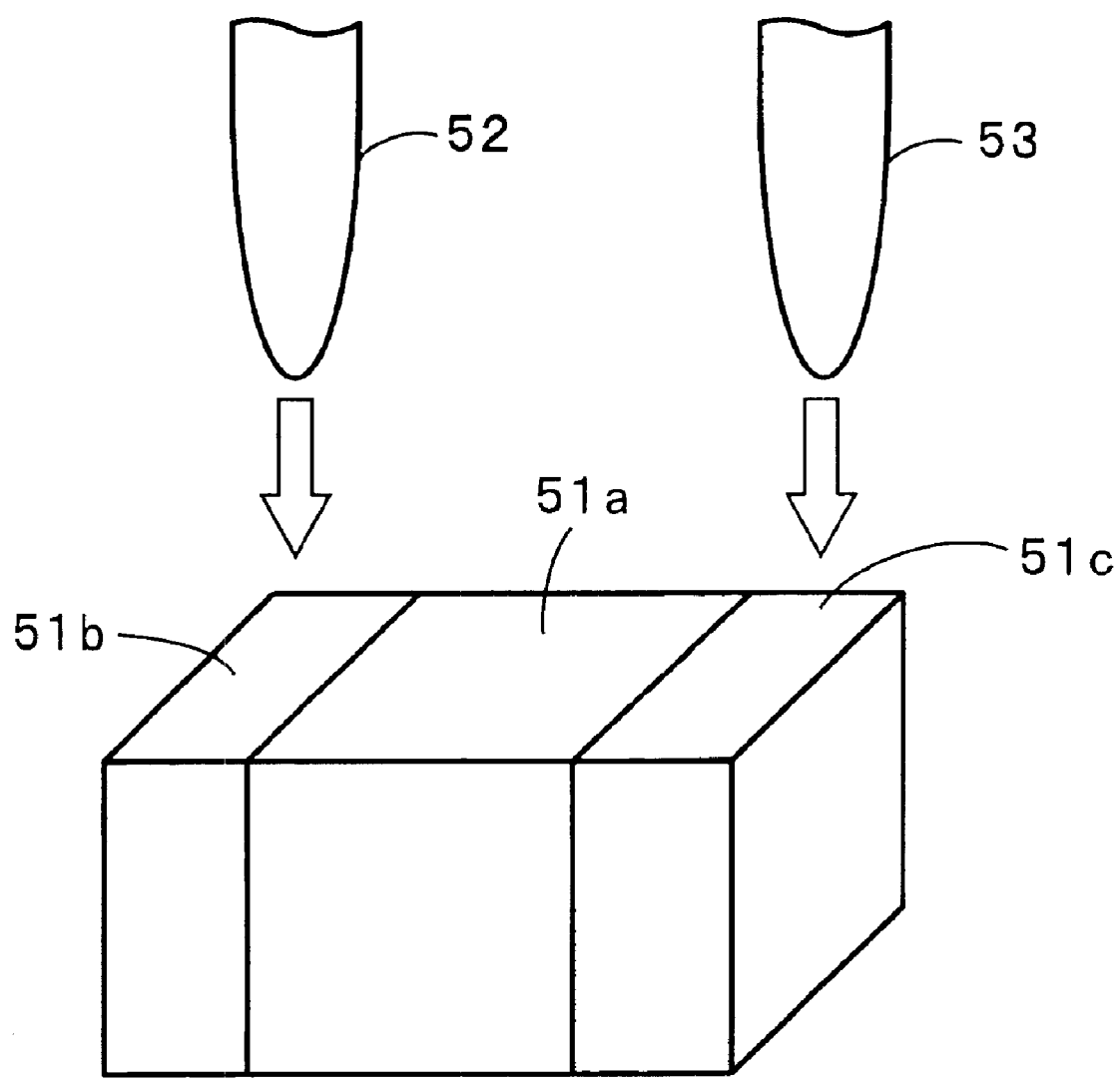
FIG. 6 is a perspective view showing another known example of an apparatus for testing an electronic component.
Figure 7:
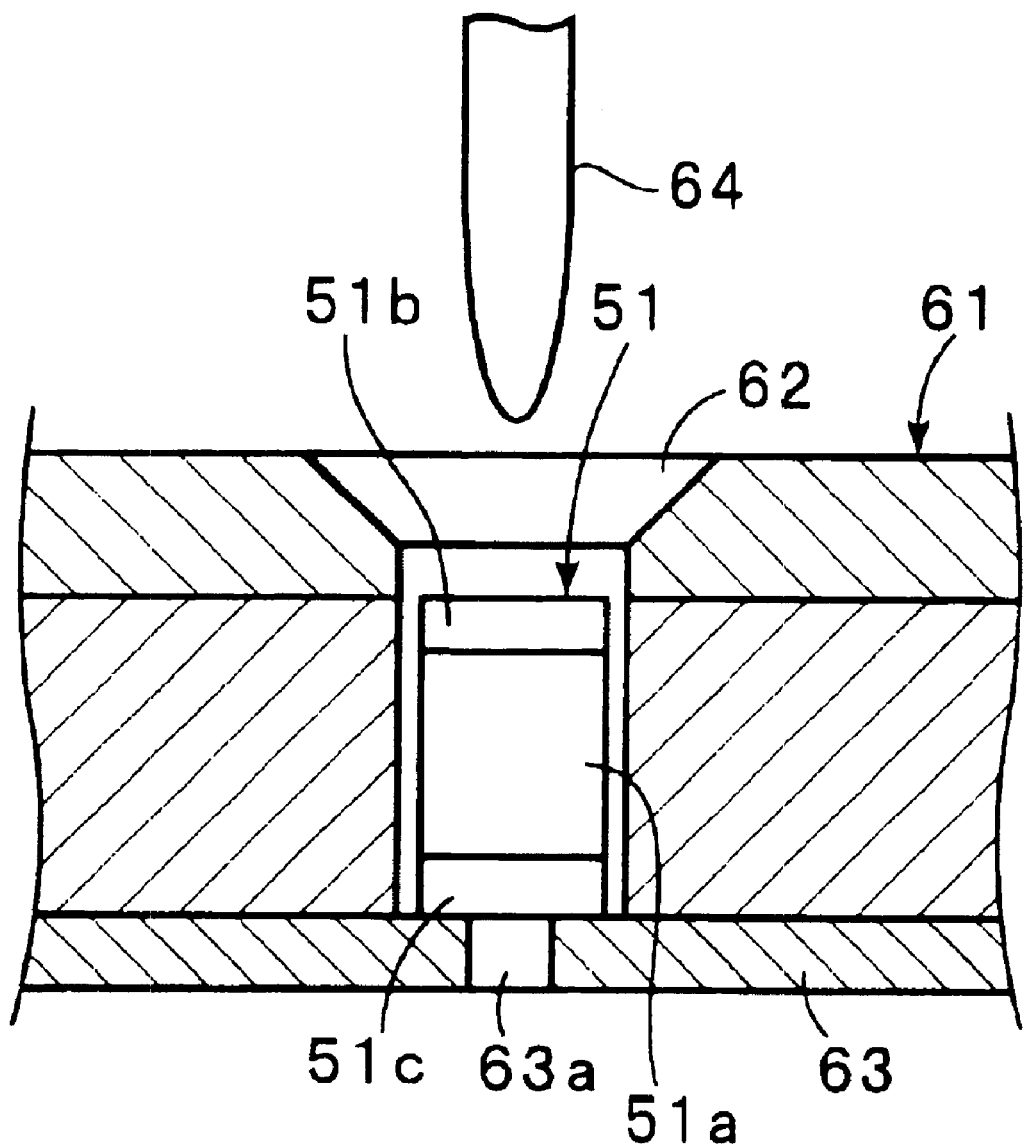
FIG. 7 is a partial-cutaway front sectional view showing another known example of an apparatus for testing an electronic component.

FIG. 4 is a partial-cutaway perspective view illustrating a modification of the apparatus for testing electronic components according to various preferred embodiments of the present invention.

As shown in FIG. 2, the apparatus for testing electronic components according to the first preferred embodiment includes a plurality of testing units arranged in a matrix. Alternatively, a plurality of testing units A may be disposed in the circumferential direction, as shown in FIG. 4. In this case, the apparatus for testing electronic components, according to preferred embodiments of the present invention, can be applied to an automatic screening machine for conveying electronic components in a rotary motion.

An electronic component tested by the apparatus of preferred embodiments of the present invention is not limited to a monolithic ceramic capacitor. Characteristics of various types of chip electronic components, which are surface-mounted and have two or more electrodes on the outer surface of each component, can be tested by the apparatus according to preferred embodiments of the present invention.

The present invention is not limited to the above-described preferred embodiments, but can be modified in the scope of the attached claims. Further, the technologies disclosed in the above-described preferred embodiments can be used in combination, as desired.

What is claimed is:

1. An apparatus for testing an electronic component, comprising:
   a substrate having at least one cavity on the upper surface thereof for accommodating an electronic component;
   at least one connecting conductor disposed at an interior of or on a lower surface of the substrate, and extending from under the cavity in a direction that is substantially perpendicular to a thickness direction of the substrate;
   a through-hole electrode disposed in the vicinity of the cavity, having a lower end that is electrically connected to the connecting conductor, and having an upper end that is attached to the upper surface of the substrate; and
   a terminal pad disposed on the upper surface of the substrate and electrically connected to the upper end of the through-hole electrode.

2. An apparatus for testing an electronic component according to claim 1, wherein said at least one connecting conductor includes a plurality of connecting conductors corresponding to electrodes of the electronic component, the plurality of connecting conductors are separated under the cavity, and the through-hole electrode and the terminal pad are provided for each of said plurality of connecting conductors.

3. An apparatus for testing an electronic component according to claim 2, further comprising a suction hole having a diameter that is smaller than that of the cavity, the suction hole opposing the cavity via the connecting conductor, and extending toward an exterior of the substrate.

4. An apparatus for testing an electronic component according to claim 3, wherein the suction hole passes through the connecting conductor.

5. An apparatus for testing an electronic component according to claim 1, wherein a plurality of testing units, each having the cavity, the connecting conductor, and the terminal pad, are arranged along a circumferential direction.

6. An apparatus for testing an electronic component according to claim 1, wherein a plurality of testing units, each having the cavity, the connecting conductor, and the terminal pad, are arranged in a matrix.

7. An apparatus for testing an electronic component according to claim 1, wherein said substrate includes at least one printed board and an insulating base material that are stacked.

8. An apparatus for testing an electronic component according to claim 1, wherein said insulating base material defines a lower surface of the substrate.

9. An apparatus for testing an electronic component according to claim 1, wherein said terminal pad is made of a copper layer coated with a nickel layer.

10. An apparatus for testing an electronic component according to claim 1, wherein an inclined surface is provided in the substrate at a top opening of the at least one cavity.

11. A method for testing an electronic component using an apparatus for testing an electronic component according to claim 1, comprising the steps of:
    inserting the electronic component into the cavity to enable a first electrode of the electronic component to contact the connecting conductor; and
    attaching a probe to the terminal pad for measuring the characteristics of the electronic component.

* * * * *